United States Patent
Chen et al.

(10) Patent No.: US 8,877,410 B2
(45) Date of Patent: *Nov. 4, 2014

(54) DATA PROCESS FOR E-BEAM LITHOGRAPHY

(71) Applicant: Taiwan Semiconductor Manufacturing Company, Ltd., Hsin-Chu (TW)

(72) Inventors: Cheng-Hung Chen, Zhubei (TW); Pei-Shiang Chen, Hsinchu (TW); Shih-Chi Wang, Taipei (TW); Jeng-Horng Chen, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/043,264

(22) Filed: Oct. 1, 2013

(65) Prior Publication Data

US 2014/0023972 A1     Jan. 23, 2014

Related U.S. Application Data

(63) Continuation of application No. 13/487,850, filed on Jun. 4, 2012, now Pat. No. 8,563,224.

(51) Int. Cl.
*G03F 1/20*     (2012.01)
*G06F 17/50*    (2006.01)
*G03C 5/00*     (2006.01)

(52) U.S. Cl.
CPC ........ *G06F 17/50* (2013.01); *G03C 5/00* (2013.01); *G03F 1/20* (2013.01); *Y10S 430/143* (2013.01)
USPC ............... 430/5; 430/30; 430/296; 430/942; 345/443; 716/53; 716/55

(58) Field of Classification Search
USPC ................ 430/5, 30, 296, 942; 716/53, 55; 345/443
See application file for complete search history.

(56) References Cited

U.S. PATENT DOCUMENTS 8,378,319 B2     2/2013   Krecinic et al.

*Primary Examiner* — Christopher Young
(74) *Attorney, Agent, or Firm* — Haynes and Boone, LLP (57) ABSTRACT

The present disclosure provides a dithering method of increasing wafer throughput by an electron beam lithography system. The dithering method generates an edge map from a vertex map. The vertex map is generated from an integrated circuit design layout (such as an original pattern bitmap). A gray map (also referred to as a pattern gray map) is also generated from the integrated circuit design layout. By combining the edge map with the gray map, a modified integrated circuit design layout (modified pattern bitmap) is generated for use by the electron beam lithography system.

17 Claims, 6 Drawing Sheets

DATA PROCESS FOR E-BEAM LITHOGRAPHY

This application is a continuation of U.S. Ser. No. 13/487,850 filed Jun. 4, 2012, the entire contents of which is hereby incorporated by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing are needed.

For example, optical lithography systems are often implemented to fabricate ICS, however, light diffraction in optical lithography systems becomes an obstacle as feature sizes are further scaled down. Common techniques used to decrease light diffraction impact includes optical proximity correction (OPC) processes, phase shift masks (PSM), and immersion optical lithography system. An electron beam lithography system is another alternative to scale down the feature size. However, wafer throughput by electron beam lithography system is a major issue for large scale fabrication in the IC industry.

Accordingly, what is needed is a method to increase wafer throughput of electron beam lithography systems.

BRIEF DESCRIPTION OF THE DRAWINGS

The present disclosure is best understood from the following detailed description when read with accompanying figures. It is emphasized that, in accordance with the standard practice in the industry, various features are not drawn to scale and are used for illustration purpose only. In fact, the dimension of the various features may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 1:
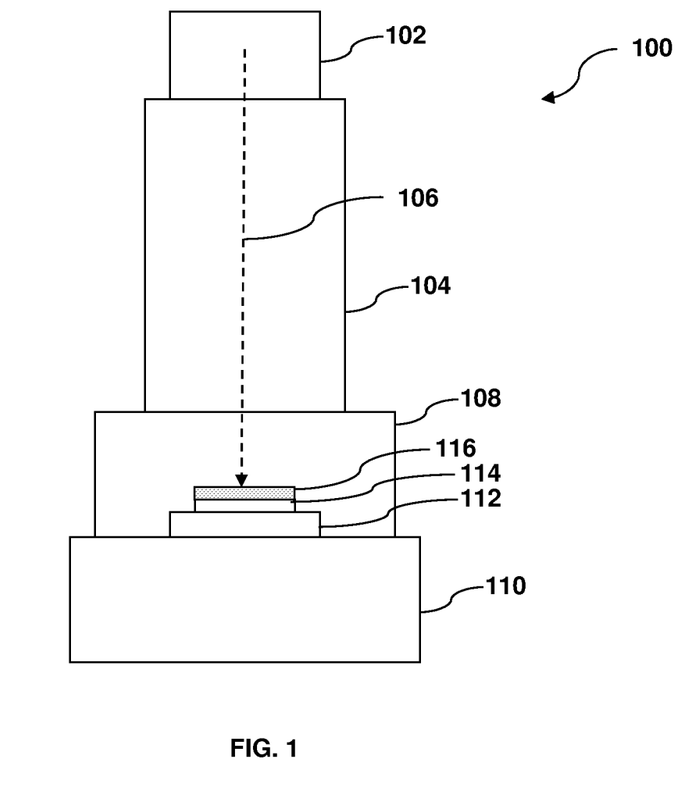
FIG. 1 represents a schematic diagram of an electron beam writer system for implementing one or more embodiments of the present disclosure.

Referring to FIG. 1, an electron beam writer system 100 is an example of a system that can benefit from one or more embodiments of the present disclosure. The electron beam writer system 100 includes an electron source 102, an electron optical column 104, an electron beam 106, a chamber 108, a pump unit 110, a stage 112, a substrate 114, and a resist film 116. However, other configurations and inclusion or omission of devices may be possible. In the present disclosure, the electron beam writer system 100 is also referred to as an electron beam lithography system or an electron beam writer. The electron source 102 provides a plurality of electrons emitted from a conducting material by heating the conducting material to a very high temperature, where the electrons have sufficient energy to overcome a work function barrier and escape from the conducting material (thermionic sources), or by applying an electric field sufficiently strong that the electrons tunnel through the work function barrier (field emission sources). The electron optical column 104 is comprised of a plurality of electromagnetic apertures, electrostatic lenses, electromagnetic lenses, shaping deflectors and cell selection deflectors; and provides the electron beam 106, such as a plurality of Gaussian spot electron beams, a plurality of variable shaped electron beams, or a plurality of cell projection electron beams. The chamber 108 is comprised of a wafer loading and unloading unit, and provides the wafer transportation without interrupting an operation of the electron beam lithography system 100 when loading the wafer into the system and unloading the wafer out of the system. The pump unit 110 is comprised of a plurality of pumps and filters, and provides a high vacuum environment for the electron beam lithography system 100. The stage 112 is comprised of a plurality of motors, roller guides, and tables; secures the substrate 114 on the stage 112 by vacuum; and provides the accurate position and movement of the substrate 114 in X, Y and Z directions during focus, leveling, and exposure operation of the substrate 114 in the electron writer system 100.

Continuing with the present embodiments, the substrate 114 deposited with the resist film 116 is loaded on the stage 112 for exposing by the electron beam 106. In the present disclosure, the resist is also referred to as a photo resist, an electron beam resist, a resist film, and a photo resist film. The substrate 114 includes a wafer substrate or a blank mask substrate. The wafer substrate includes a silicon wafer. Alternatively or additionally, the wafer may include another elementary semiconductor, such as germanium; a compound semiconductor including silicon carbide, gallium arsenic, gallium phosphide, indium phosphide, indium arsenide, and/ or indium antimonide; an alloy semiconductor including SiGe, GaAsP, AlInAs, AlGaAs, GaInAs, GaInP, and/or GaInAsP. In yet another alternative, the wafer is a semiconductor on insulator (SOI). A plurality of conductive and non-conductive thin films may be deposited on the wafer. For example, the conductive thin films may include a metal such as aluminum (Al), copper (Cu), tungsten (W), nickel (Ni), titanium (Ti), gold (Au), and platinum (Pt) and, alloys thereof. The non-conductive thin films may include an insulator, such as silicon oxide, silicon nitride, or a combination thereof. The blank mask substrate may include a low thermal expansion material such as quartz, silicon, silicon carbide, or silicon oxide-titanium oxide compound.

Figure 2:
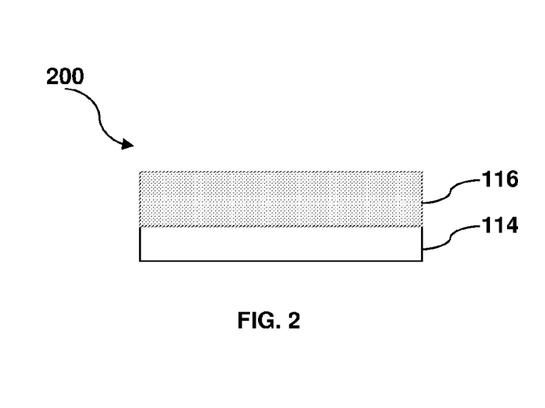
FIGS. 2-5 are cross-sectional side views illustrating forming a resist pattern according to one or more embodiments of the present disclosure.
Figure 3:
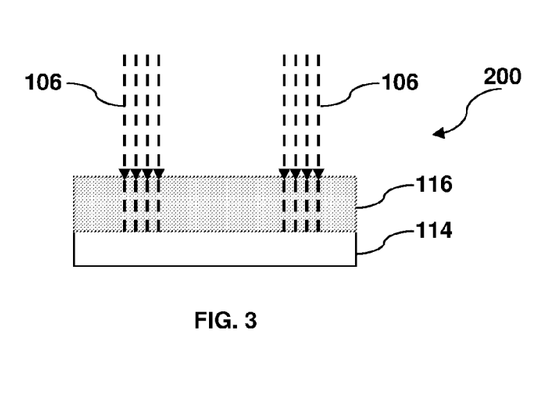
Figure 4:
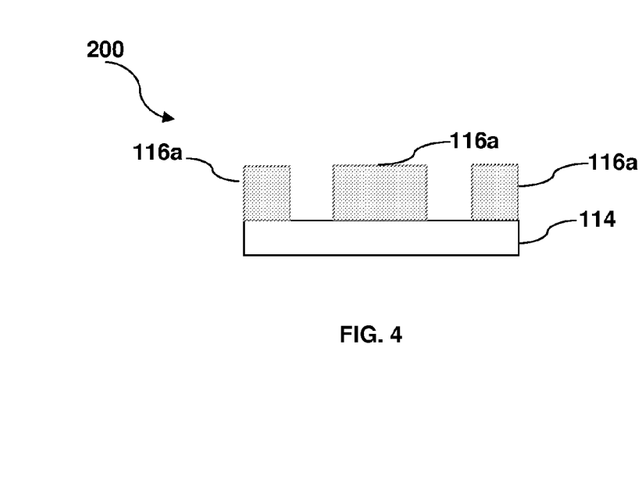
Figure 5:
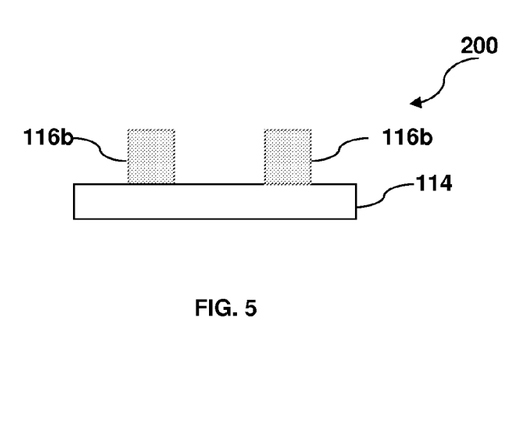

Referring now to FIGS. 2-5, a process 200 can be performed with the system 100 to implement one or more embodiments of the present disclosure. Referring to FIG. 2, the resist film 116 is deposited on the substrate 114, for example, by a spin-on coating process followed by a soft bake (SB) process. The resist film 116 may include a positive tone resist or a negative tone resist. The resist film 116 may include a single resist film or a multiple layer resist film. Referring to FIG. 3, the resist film 116 is exposed by the plurality of electron beams 106 using the electron beam writer system 100 as shown in FIG. 1 to form a latent image pattern in the resist film 116. After the exposure, a developer is applied to the surface of the resist film for developing a resist pattern. The process 200 may include a post exposure bake process (PEB), a post develop bake process (PDB), or both. The final resist pattern depends on the resist tone of the resist film 116. For example, if the resist film 116 is a positive tone resist applied to the substrate 114, the exposed portions of the resist film 116 are dissolved during the developing process and the unexposed portions of the resist film 116 remain to form a patterned resist film 116a, providing the final resist pattern shown in FIG. 4. In another example, if the resist film 116 is a negative tone resist applied to the substrate 114, the unexposed portions of the resist film 116 are dissolved during the developing process and the exposed portions of the resist film 116 remain after the developing process to form a patterned resist film 116b, providing the final resist pattern shown in FIG. 5.

Figure 6:
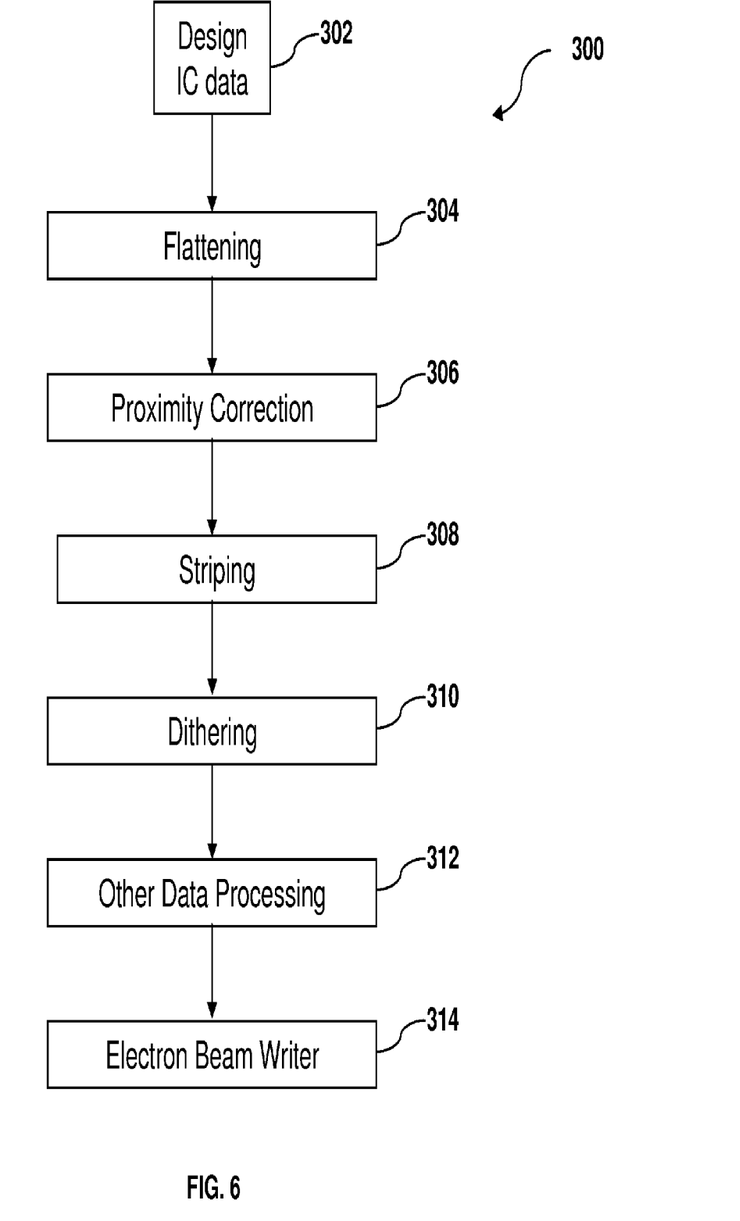
FIG. 6 is a flow chart of an integrated circuit (IC) design data flow in an electron beam writer system for implementing one or more embodiments of the present disclosure.

Referring now to FIG. 6, a method 300 includes using the electron beam writer system 100 to expose the resist film 116 deposited on the substrate 114 according to one or more embodiments of the present disclosure. First, the method 300 begins at step 302 by receiving an integrated circuit (IC) layout data from a designer. The designer can be a separate design house or can be part of a semiconductor fabrication facility (fab) for making IC productions according to the IC design layout data. In the present disclosure, the IC design layout data is also referred as to an IC design layout pattern. The IC design layout data is presented in a GDS file format or other suitable file format. The method 300 proceeds to step 304 for flattening the IC design layout pattern. The flattening process includes decomposing the IC design layout pattern into a plurality of primitive patterns, such as rectangular and triangular patterns, and eliminating any overlap of the primitive patterns. The method 300 then proceeds to step 306 for an electron proximity correction (EPC). The EPC is a compensation process for critical dimension due to an electron scattering from the substrate. The EPC process may include size bias correction, shape correction, dose correction, and background dose equalization (GHOST) correction. After the EPC correction at step 306, the method 300 proceeds to step 308 for a striping process. The striping process divides the EPC modified design layout data into a plurality of sub-fields and further divides into a plurality of sub-sub-fields. After the striping process at step 308, the method 300 proceeds to step 310 for a dithering process. The dithering process converts the IC design layout pattern from a design grid to an electron beam writer grid to increase the throughput of the electron beam lithography system 100. In the present disclosure, the grid is also referred to as pixel. The dithering process will be discussed subsequently in more detail. After the dithering process at step 310, the method 300 proceeds to step 312 for other data processing. For example, an error check is performed and the data is converted to an electron beam writer format data. The method 300 proceeds to step 314, where the IC design layout pattern is written on a substrate by an electron beam writer, such as the electron beam writer 100 as shown in FIG. 1. Additional steps can be provided before, during, and after the method 300, and some of the steps described can be replaced, eliminated or moved around for additional embodiments of the method.

As shown in FIG. 3, no mask or reticle is used to form the IC layout pattern in the resist film 116 deposited on the substrate 114. The IC design layout pattern is directly written on the resist film 116 deposited on the substrate 114 by the plurality of patterned electron beams. However, the small pixels occupy a plurality of data storage space and more time is needed to process, and further more time is needed to write the plurality of patterns on the resist film deposited on the substrate by the electron beam writer system 100 and thereby a throughput for the electron beam writer system 100 is low. For example, if the pixel size is 5 nm, $4 \times 10^{12}$ pixels are needed to occupy a 10×10 mm square area and $2.5 \times 10^{11}$ pixels are needed for the same area if the pixel size increases from 5 nm to 20 nm. In order to increase the throughput of the electron beam lithography system, the pattern is converted from the IC design grid to the electron beam writer grid. In other words, the pattern bitmap is converted from a small pixel size to a large pixel size. The dithering process is involved during the conversion from the small pixel size to the large pixel size.

Figure 7:
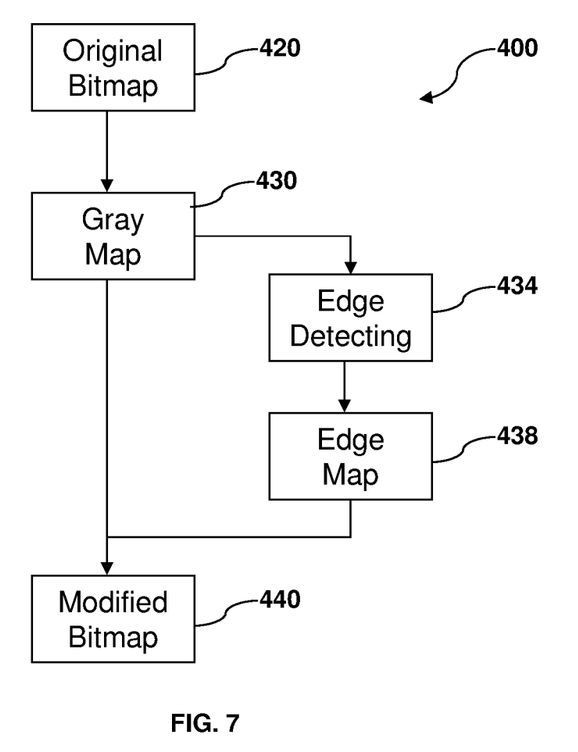
FIG. 7 is a flow chart of a dithering method for the electron beam writer system according to one or more embodiments of the present disclosure.

Referring now to FIG. 7, a method 400 for dithering a bitmap pattern includes using an edge detector to define an edge and finish the conversion from the small pixel to the large pixel according to one or more embodiments of the present disclosure. The method 400 may be implemented in the dithering step 310 of the method 300 of FIG. 6. Initially, the method 400 begins at step 420 by receiving an original bitmap with a small design pixel. The original bitmap is from the EPC modified IC design layout pattern in the method 300. Then, the method 400 proceeds per one route to step 430 for a gray map. The gray map is converted from the original bitmap and has a large pixel size. At the same time, the method 400 also proceeds per another route to step 434 for forming the bitmap edge by the edge detector, and then the method 400 continually proceeds to step 438 for generating an edge map. Detecting the edge at step 434 and forming edge map at step 438 are off line processes and time consuming. Eventually, both routes of the method 400 recombine and proceed to step 440 for generating a modified bitmap with a large pixel. The modified bitmap is based on the gray map and the edge map.

Figure 8:
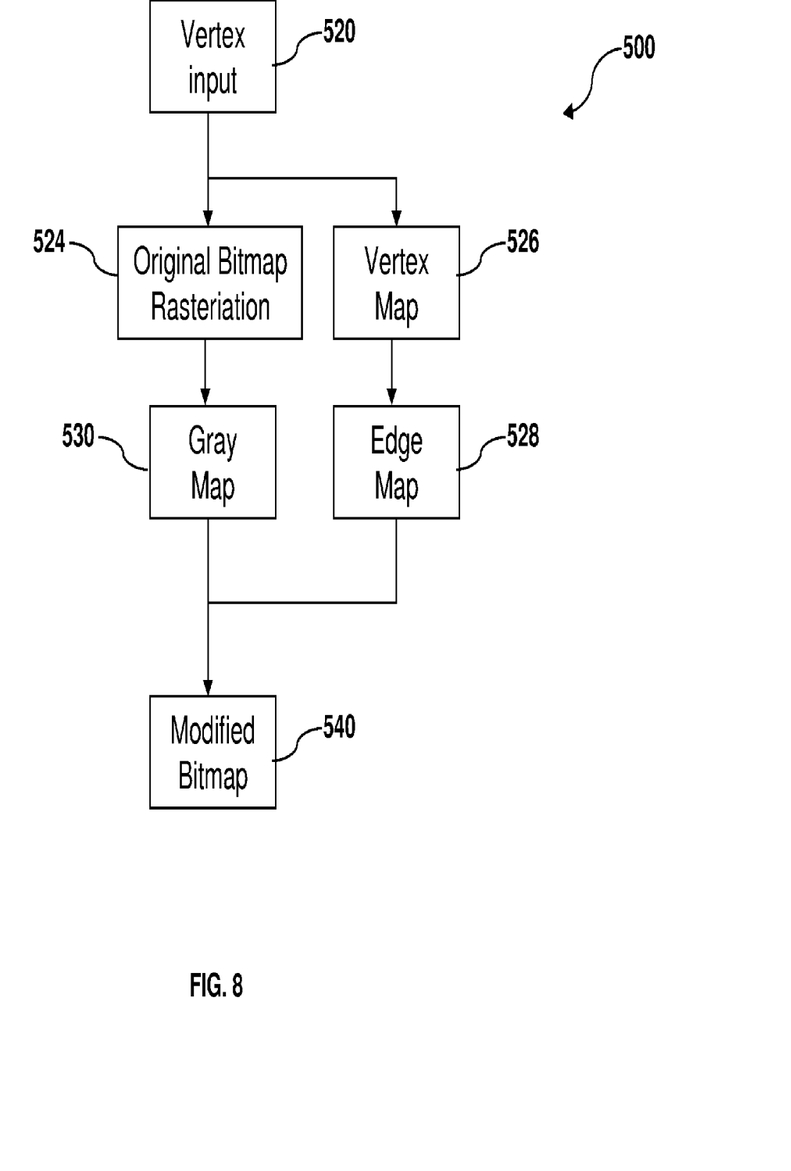
FIG. 8 is a flow chart of a dithering method using a vertex method for the electron beam writer system according to one or more embodiments of the present disclosure.

Referring now to FIG. 8, a method 500 for dithering the bitmap pattern with the small pixel size includes using a vertex map to define and form the edge map for implementing one or more embodiments of the present disclosure. The method 500 may be implemented in the dithering step 310 of the method 300 of FIG. 6. Initially, the method 500 begins at step 520 by receiving a vertex input. The method 500 proceeds per one route to step 520 for applying the vertex input to the original bitmap with a small design pixel size by a vertex rasterization. Then, the method 500 proceeds per one route to step 430 for generating the gray map. The gray map has a large pixel size. At the same time, the method 500 also proceeds per another route to step 526 for generating a vertex map, and then the method 500 continually proceeds to step 528 for generating the edge map based on the vertex map. Eventually, both routes of the method 500 recombine and proceed to step 540 for generating the modified bitmap with a large pixel size. The modified bitmap based on the gray map and the edge map, which was generated based on the vertex map. Additional steps can be provided before, during, and after the method 500, and some the steps described can be replaced, eliminated, or moved around for additional embodiments of the method 500.

Figure 11:
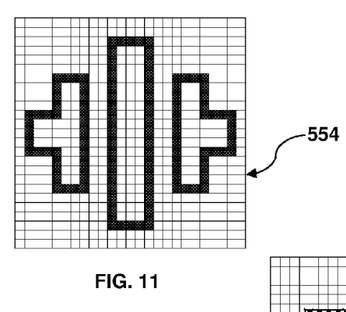
Figure 12:
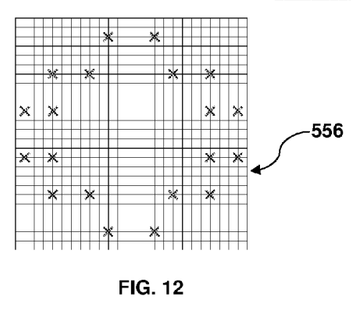
Figure 13:
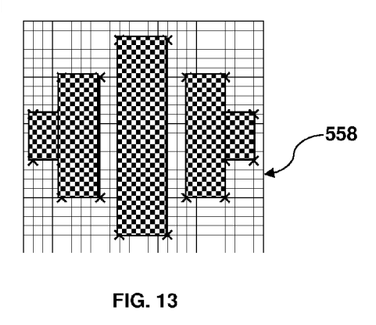

FIGS. 9-13 present pattern views at each step of dithering the bitmap pattern in the method 400 and the method 500 for implementing one or more embodiments of the present disclosure. A bitmap 550 is presented in FIG. 9. The bitmap 550 is formed from the IC design layout pattern by the vertex rasterization and therefore has the small pixel size. The gray map 552 is presented in FIG. 10. The gray map 552 has the large pixel size and is converted from the original bitmap 550. The edge map 554 is presented in FIG. 11. In the method 400, the edge map 554 is generated by finding the edge with the edge detector. In the method 500, the edge map 554 is generated by the vertex map 556 in FIG. 12. The final bitmap 558 with the large pixel size in FIG. 13 is formed by recombining the gray map 552 and the edge map 554.

Figure 9:
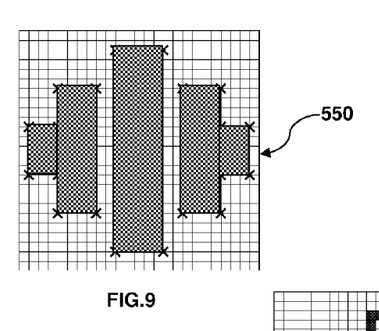
FIGS. 9-13 illustrate schematic views of an IC design pattern during a dithering process for the electron beam writer system for implementing one or more embodiments of the present disclosure.
Figure 10:
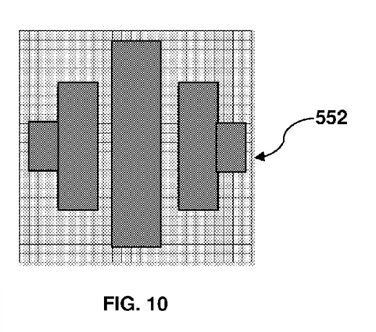

In the current method 400, where the edge map 554 is generated using an edge detector, converting the original bitmap 550 with the small pixel size to the bitmap 558 with the large pixel size, has several issues because of an edge error. For example, a standard Floyd-Steinberg error diffusion algorithm requires neighborhood operations and may pass the quantization error to the neighbor pixels and propagate to neighborhood polygons. In another example, an edge-enhancement dithering algorithm has a better image quality than the standard Floyd-Steinberg error diffusion algorithm. However, the edge-enhancement dithering algorithm may suffer from the deficiencies of the edge detectors. Furthermore, using an edge detector also needs a large computer buffer to process and store the full edge map; and therefore a long and off-line data process is needed to generate the edge map. Thus, in the current dithering method 400, the edge error may affect the feature critical dimension (CD) uniformity and overlay accuracy of the features, and the low throughput is caused by the long and offline data processing to define the edge and the edge map.

In the method 500, the bitmap 550 is formed from the vertex map 556 by adopting the vertex information of a polygon for implementing one or more embodiments of the present disclosure. In the method 500, the vertex map 556 of the polygon applies an edge-adaptive algorithm to the bitmap 550 adjusting the weightings for diffusing error to neighborhood pixels and generates the closed edge map 554 with the same quality as the edge-enhancement algorithm without extra step. The gray map 552 with the large pixel size recombines with the edge map 554 to form the bitmap 558 with the large pixel size.

Hence, forming the bitmap 558 with the large pixel size for the electron beam writer is improved in the method 500 according to one or more embodiments of the present disclosure. First, the edge map 554 as shown in FIG. 11 generated through the vertex map 556 as shown in FIG. 12 has the same quality as an edge map generated using edge detecting using the complicated and time consuming edge enhancement algorithm. Second, no extra edge map data is needed to generate the edge map 554 and therefore the memory size for the data process is reduced. Third, the vertex file has the advantage of a compressing file. In addition, the data can be processed parallelly and the bitmap 558 as shown in FIG. 13 is generated on line. Finally, because of saving time for generating the bitmap for the electron beam writer, the wafer throughput is improved.

The methods and systems described herein can take the form of an entirely hardware embodiment, an entirely software embodiment, or an embodiment containing both hardware and software elements. Further, the methods and system described herein, or certain aspects or portions thereof, may take the form of program code (instructions) embodied in tangible media, such as floppy diskettes, CD-ROMS, hard drives, or any other machine-readable storage medium, wherein, when the program code is loaded into and executed by a machine, such as a computer, the machine becomes an apparatus for practicing the present disclosure. The methods and apparatus of the present invention may also be embodied in the form of program code transmitted over some transmission medium, such as electrical wiring or cabling, through fiber optics, or via any other form of transmission, wherein, when the program code is received and loaded into and executed by a machine, such as a computer, the machine becomes an apparatus for practicing the present disclosure. When implemented on a general-purpose processor, the program code combines with the processor to provide a unique apparatus that operates analogously to specific logic circuits.

Thus, the present disclosure describes a method of exposing the resist film deposited on the substrate in the electron beam writer. The patterned electron beam data is generated through the vertex map. The pattern edge map is directly created from the vertex map. By recombining the pattern gray map and the pattern edge map, the pattern bitmap used by the electron beam writer is formed. Because of the convenience of generating the pattern edge map, the patterned electron beam data used to write the pattern to the resist film by the electron beam writer can be generated on line and therefore the throughput for the electron beam writer is increased.

The present disclosure also describes a method of generating the pattern edge map through the vertex map. The vertex map is directly created from the original pattern map and therefore no extra step is needed to generate the pattern edge map. The method needs less data processing space and generates the patterned electron beam data on line and therefore the throughput for the electron beam writer is increased.

In another embodiment, a method of forming a photo resist pattern by the electron beam writer is described. The photo resist is deposited on the substrate by a spin-on process to form the photo resist film. The photo resist film deposited on the wafer substrate is exposed on the electron beam writer by using the bitmap generated by the vertex map. Because of the small data size of the vertex map, the bitmap can be generated online and therefore the throughput of the wafer from the electron beam writer is increased.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   receiving an integrated circuit (IC) design layout;
   generating a vertex information from the IC design layout;
   generating a gray map from the IC design layout, wherein the gray map is generated based on the vertex information;
   generating an edge map from the IC design layout, wherein the edge map is generated based on the vertex information; and
   modifying the IC design layout based on the gray map and the edge map.

2. The method of claim 1 wherein:
   the IC design layout includes a plurality of first pixels having a first pixel size; and
   the modified IC design layout includes a plurality of second pixels having a second pixel size larger than the first pixel size.

3. The method of claim 1 wherein the receiving the IC design layout includes receiving an electron proximity correction (EPC) modified IC design layout.

4. The method of claim 1 further including writing a pattern on a substrate based on the modified IC design layout.

5. The method of claim 1 wherein the vertex information is generated by vertex rasterization.

6. The method of claim 1 wherein generating the vertex information is associated with features of the IC design layout.

7. The method of claim 6 wherein the features of the IC design layout includes polygon patterns of the IC design layout.

8. A method comprising:
   receiving an integrated circuit (IC) design layout;
   modifying the IC design layout using an electron proximity correction (EPC) technique;
   dithering the EPC modified IC design layout, wherein the dithering includes:
   generating a vertex information from the EPC modified IC design layout,
   generating a gray map based on the vertex information,
   generating an edge map based on the vertex information, and
   dithering the EPC modified IC design layout based on the gray map and the edge map; and
   converting the dithered, EPC modified IC design layout into an electron beam writer format data.

9. The method of claim 8 further comprising writing the electron beam writer format data on a substrate.

10. The method of claim 9, wherein writing the electron beam writer format includes exposing a resist film coated on the substrate to an electron beam, such that a pattern of a layer of an IC is formed in the resist film.

11. The method of claim 8 wherein the EPC modified IC design layout includes a plurality of first pixels having a first pixel size and the dithered EPC modified IC design layout includes a plurality of second pixels having a second pixel size that is larger than the first pixel size.

12. The method of claim 8 further comprising flattening the IC design layout before modifying the IC design layout using the EPC technique.

13. The method of claim 12 wherein flattening the IC design layout data includes decomposing the IC design layout into primitive patterns and eliminating any overlap of the primitive patterns.

14. The method of claim 12 further comprising striping the IC design layout before modifying the IC design layout using the EPC technique.

15. The method of claim 14, wherein the striping includes dividing the EPC modified IC design layout into a plurality of sub-fields, and further dividing the sub-fields into a plurality of sub-sub-fields.

16. The method of claim 8, wherein the EPC technique includes at least one of a dose correction, a pattern size bias correction, a pattern shape correction, and a background dose equalization correction.

17. The method of claim 8, wherein the vertex information is generated by vertex rasterization.

* * * * *